US005286928A

United States Patent [19]

Borland

[11] Patent Number: 5,286,928

[45] Date of Patent: Feb. 15, 1994

[54] TUNABLE SPEAKER TUBE

[76] Inventor: Nathan J. Borland, R.R. #3, Box 120, Barton, Vt. 05822

[21] Appl. No.: 44,809

[22] Filed: Apr. 12, 1993

[51] Int. Cl.[5] ..................... H05K 5/00

[52] U.S. Cl. ..................... 181/153; 181/156; 181/199

[58] Field of Search ............... 181/144, 146, 147, 148, 181/151, 152, 153, 155, 156, 196, 197, 199; 381/154, 156, 158, 159, 160

[56] References Cited

U.S. PATENT DOCUMENTS 3,768,589 10/1973 Nilsson et al. .................. 181/196 X
3,826,333 7/1974 Buckwalter .................. 181/153
4,213,515 7/1980 Laupman .................. 181/156 X
4,567,959 2/1986 Prophit .................. 181/156
4,756,382 7/1988 Hudson, III .................. 181/156
4,805,729 2/1989 Wascom .................. 181/144
5,191,177 3/1993 Chi .................. 181/153

*Primary Examiner*—Michael L. Gellner
*Assistant Examiner*—Khanh Dang
*Attorney, Agent, or Firm*—Leon Gilden

[57] ABSTRACT

A speaker tube structure formed of a semi-cylindrical first side wall portion and a planar second side wall portion, with the second side wall portion including speaker members mounted therewithin, having a tuning port orthogonally directed into the second side wall portion extending into the speaker tube cavity in a spaced adjacency relative to the tube axis. The tuning port is arranged to receive a plurality of inserts to permit tuning of the speaker tube.

3 Claims, 4 Drawing Sheets

TUNABLE SPEAKER TUBE

BACKGROUND OF THE INVENTION

1. Field of the Invention

The field of invention relates to speaker enclosure structure, and more particularly pertains to a new and improved tunable speaker tube wherein the same is arranged for effecting efficient reflection of sound within the tube cavity.

2. Description of the Prior Art

Speaker tubes typically of polygonal type configurations loose response within the enclose, wherein the instant invention attempts to overcome deficiencies of the prior art by providing for a semi-cylindrical tube structure arranged to enhance reflection of sound within the tube enclosure.

Prior art speaker tube structure is indicated in U.S. Pat. No. 4,757,548 to Fenner indicating a dome-shaped enclosure in contrast to the cylindrical construction of the instant invention, wherein U.S. Pat. Nos. 3,449,519; 5,025,473; and 4,122,302 are further examples of conventional speaker enclosure structure.

SUMMARY OF THE INVENTION

In view of the foregoing disadvantages inherent in the known types of speaker enclosure construction now present in the prior art, the present invention provides a tunable speaker tube wherein the same is arranged to provide for a semi-cylindrical cavity arranged to enhance reflection of sound within the cavity through an associated tune port entrance in communication with the cavity. As such, the general purpose of the present invention, which will be described subsequently in greater detail, is to provide a new and improved tunable speaker tube which has all the advantages of the prior art speaker enclosure constructions and none of the disadvantages.

To attain this, the present invention provides, a speaker tube structure formed of a semi-cylindrical first side wall portion and a planar second side wall portion, with the second side wall portion including speaker members mounted therewithin, having a tuning port orthogonally directed into the second side wall portion extending into the speaker tube cavity in a spaced adjacency relative to the tube axis. The tuning port is arranged to receive a plurality of inserts to permit tuning of the speaker tube.

My invention resides not in any one of these features per se, but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved tunable speaker tube which has all the advantages of the prior art speaker enclosure constructions and none of the disadvantages.

It is another object of the present invention to provide a new and improved tunable speaker tube which may be easily and efficiently manufactured and marketed.

It is a further object of the present invention to provide a new and improved tunable speaker tube which is of a durable and reliable construction.

An even further object of the present invention is to provide a new and improved tunable speaker tube which is susceptible of a low cost of manufacture with regard to both materials and labor, and which accordingly is then susceptible of low prices of sale to the consuming public, thereby making such tunable speaker tubes economically available to the buying public.

Still yet another object of the present invention is to provide a new and improved tunable speaker tube which provides in the apparatuses and methods of the prior art some of the advantages thereof, while simultaneously overcoming some of the disadvantages normally associated therewith.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
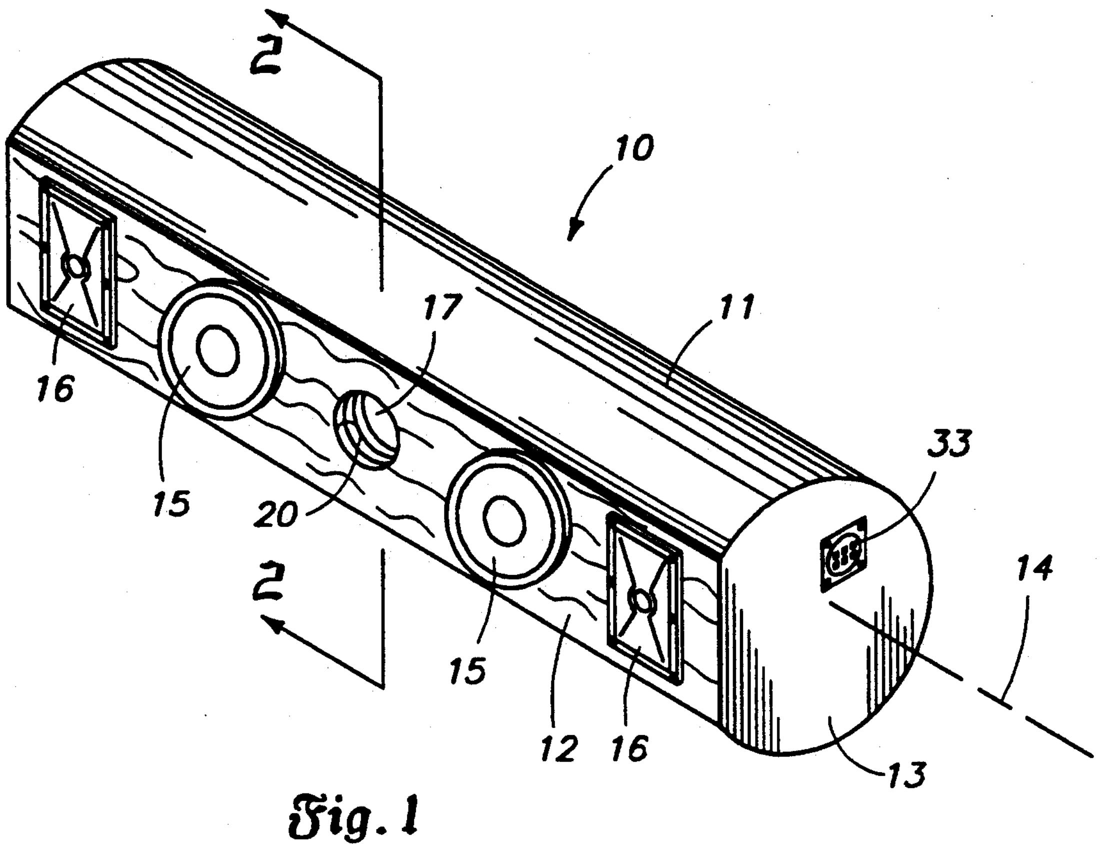
FIG. 1 is an isometric illustration of the invention.
Figure 2:
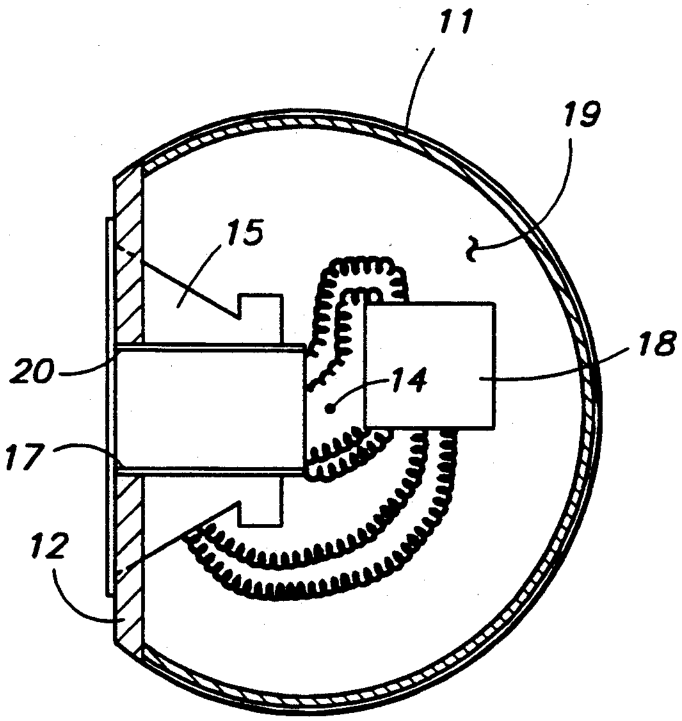
FIG. 2 is an orthographic view, taken along the lines 2—2 of FIG. 1 in the direction indicated by the arrows.
Figure 3:
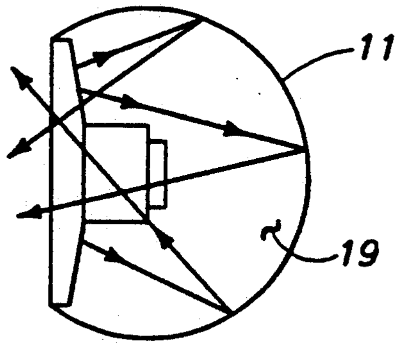
FIG. 3 is a diagrammatic illustration of sound reflection within the speaker enclosure.

With reference now to the drawings, and in particular to FIGS. 1 to 8 thereof, a new and improved tunable speaker tube embodying the principles and concepts of the present invention and generally designated by the reference numeral 10 will be described.

More specifically, the tunable speaker tube 10 of the instant invention essentially comprises a semi-cylindrical first side wall 11 defining an arc of substantially two hundred seventy degrees, with the tube mounting a planar second side wall 12 defining a tube cavity 19, with the planar second side wall 12 oriented parallel relative to the tube axis 14. End walls effect enclosure about the tube cavity 19. First and second speaker members 15 and 16 are mounted in projecting relationship through the second side wall 12, with a tuning port 17 having a predetermined diameter extending orthogonally through the second side wall extending into the cavity 19 in a spaced adjacency relative to the axis 14. A crossover network 18 of conventional construction is mounted within the cavity 19 to effect various frequency crossover relative to the first and second speakers utilizing an input terminal 33 directed into and in communication with the crossover network.

Figures 4A, 4B, 4C:
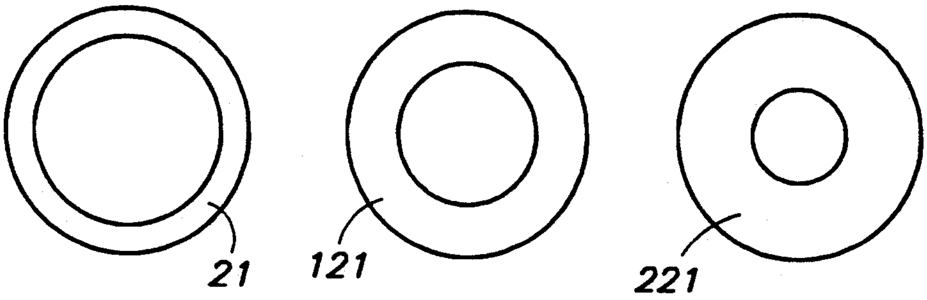
FIGS. 4*a*, 4*b*, and 4*c* are examples of various inserts for use within the tuning port at the entrance thereof, as indicated in FIG. 4.
Figure 4:
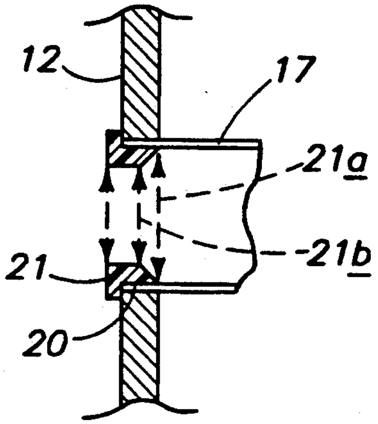
FIG. 4 is an orthographic view of an insert member mounted at the entrance of the tuning port.

The tuning port 17 includes a port entrance 20 within the second side wall 12, with the port entrance 20 defined by a predetermined diameter. Reference to the FIGS. 4, 4*a*, 4*b*, and 4*c* indicate the use of various insert rings 21 arranged for mounting within the port entrance 20, with the insert rings each including an outer diameter 21*a* arranged for complementary securement within the port entrance 20, with each of the rings 21 including a second diameter 21*b* less than said predetermined diameter to provide for attenuation of various sounds reflected within the cavity 19 for enhanced tuning of the organization. The FIGS. 4*a*, 4*b*, and 4*c* indicate the use of rings 21, 121, and 221 respectively, each having various second diameters of decreasing size to effect various attenuation of reflected sounds within the cavity 19.

Figure 5:
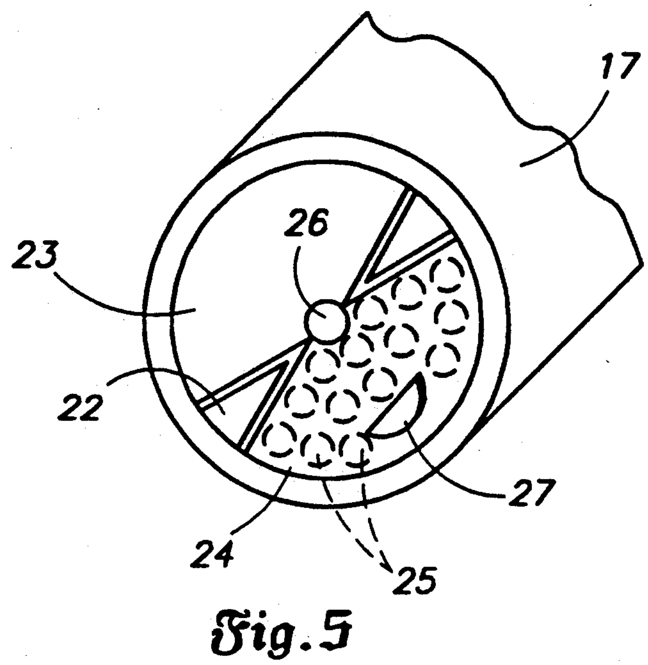
FIG. 5 is an isometric illustration of a tuning disc structure arranged for mounting to the entrance port of the tuning port.
Figure 5A:
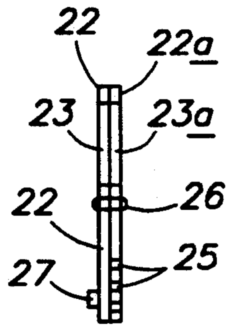
FIG. 5*a* is an orthographic side view of the disc construction, as indicated in FIG. 5.

Further, the FIGS. 5 and 5*a* indicates the use of a tuning disc member arranged for mounting within the port entrance 20. The disc member includes first disc 22 mounted and in contiguous communication to a second disc 22*a*, with the first disc having a first disc cover plate 24 of a generally semi-annular configuration arranged to selectively cover a matrix of second disc apertures 25, also relative to a first disc opening 23 within the first disc 22 arranged for selective alignment with second disc opening 23*a* of a complimentary configuration within the second disc 22*a* such that the first disc opening 23 permits selective alignment with the second disc opening 23*a* or the matrix of second disc apertures 25 for various modulation of reflected sounds within the cavity 19. A disc axle 26 coaxially and rotatably mounts the first disc relative to the second disc, as indicated in FIGS. 5 and 5*a*. A disc handle 27 mounted to the first disc is arranged for ease of rotation of the first disc relative to the second disc, with the second disc fixedly mounted within the entrance 20 and the first disc rotatably mounted relative to the second disc.

Figure 6:
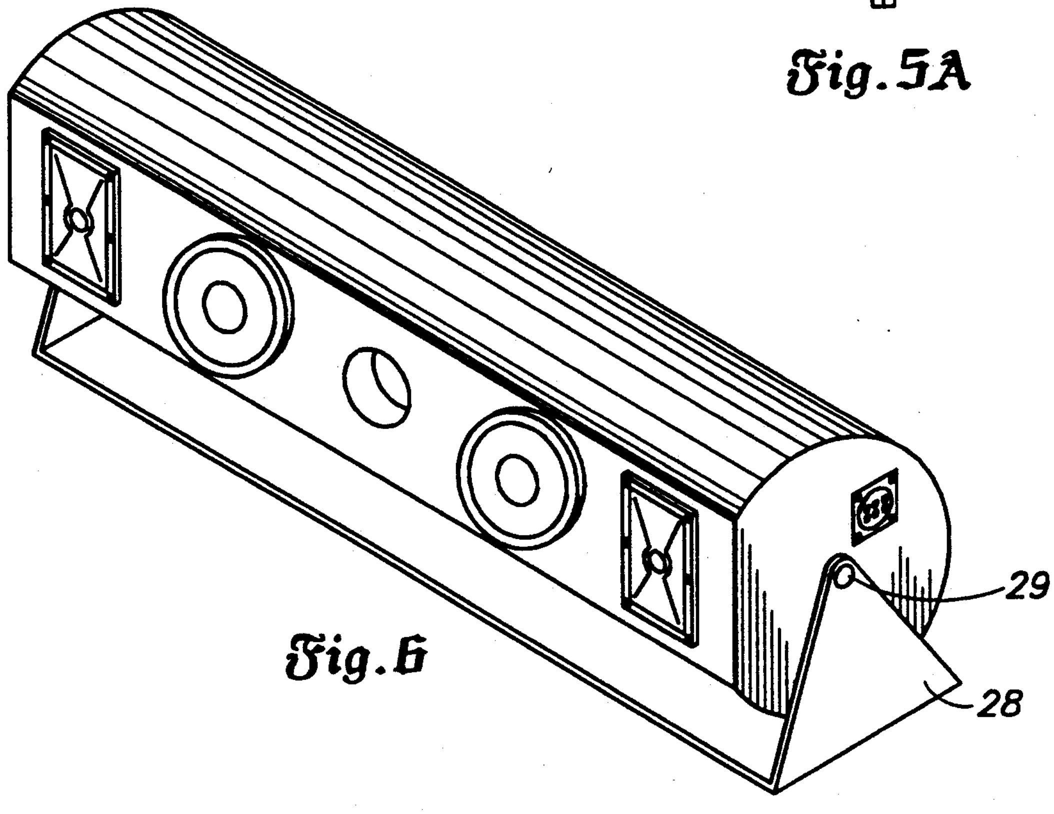
FIG. 6 is an isometric illustration of the invention mounted upon a support bracket structure.

The FIG. 6 indicates the use of a support bracket 28, having a support bracket axle 29 permitting ease of pivoting of the speaker tube relative to the support bracket, with the axle 29 coaxially aligned relative to the axis 14 of the tube 10.

Figure 7:
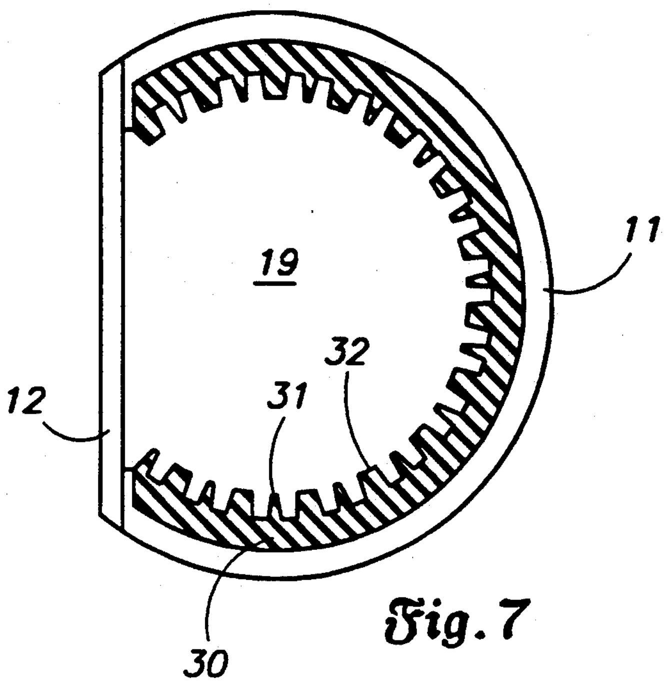
FIG. 7 is an orthographic view of a liner arranged for optional insertion within the speaker tube to provide for selective dampening of sound as desired.
Figure 8:
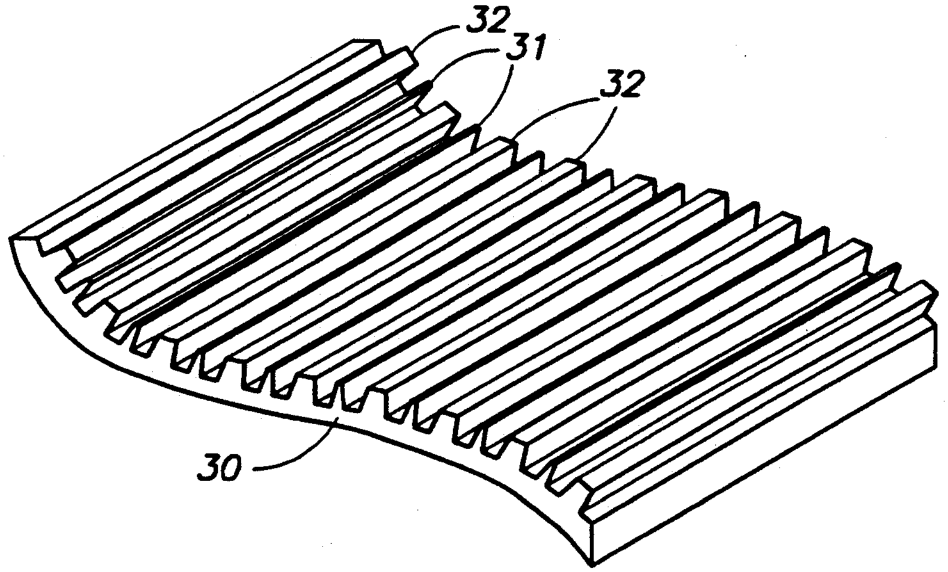
FIG. 8 is an isometric illustration of the insert of FIG. 7.

The FIGS. 7 and 8 indicate a resilient cavity liner 30 arranged for selective mounting coextensive with the cavity 19 within an interior surface of the semi-cylindrical first side wall 11. The liner 30 includes alternating triangular and polygonal ribs 31 and 32 arranged in a parallel relationship along the liner and parallel to the axis 14.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. A tunable speaker tube, comprising, a semi-cylindrical first side wall, and a planar second side wall, with the tube including spaced end walls defining enclosed tube cavity, the first side wall symmetrically oriented about a predetermined axis, with the second side wall parallel to said axis, and at least one first speaker member and at least one second speaker member mounted into the second side wall in communication with the cavity, and a tuning port having a predetermined diameter orthogonally directed medially of the second side wall extending into the cavity in a spaced adjacency relative to the axis, with the tuning port having a port entrance at the second side wall, and an insert member mounted within the tuning port at the port entrance, with the insert member having a restricted opening for communication with the cavity through the tuning port, with the restricted opening less than said predetermined diameter, and the insert member including a rotary first disc rotatably mounted relative to a fixed second disc, with the first disc and second disc mounted at the port entrance, the second disc including a second disc semi-cylindrical opening and a second disc matrix of apertures spaced from said second disc opening, with the first disc having a first disc opening of a complementary configuration to said second disc opening, with the first disc opening arranged for selective communication with the second disc opening and the apertures, with a disc axle rotatably mounting the first disc to the second disc, with the disc axle orthogonally oriented relative to the axis.

2. A speaker tube as set forth in claim 1 wherein the first disc includes a disc handle projecting from the first disc permitting ease of manual grasping and rotation of the first disc relative to the second disc.

3. A speaker tube as set forth in claim 2 including a resilient cavity liner mounted coextensively within the cavity in coextensive communication with the first side wall within the cavity, with the liner including alternating parallel ribs, wherein said ribs include first ribs and second ribs, wherein the first ribs are of a triangular cross-sectional configuration, and the second ribs are of a polygonal cross-sectional configuration to effect desired attenuation and muffling of auditory waves within the cavity from the second speaker member and the first speaker member.

* * * * *